US012757501B2

(12) United States Patent
Hu et al.

(10) Patent No.: US 12,757,501 B2
(45) Date of Patent: Oct. 6, 2026

(54) HETEROJUNCTION SOLAR CELL AND MANUFACTURING METHOD THEREOF, AND PHOTOVOLTAIC MODULE

(71) Applicant: Trina Solar Co., Ltd., Changzhou (CN)

(72) Inventors: Yunyun Hu, Changzhou (CN); Wei Liu, Changzhou (CN); Daming Chen, Changzhou (CN)

(73) Assignee: Trina Solar Co., Ltd., Changzhou (CN)

( * ) Notice: Subject to any disclaimer, the term of this patent is extended or adjusted under 35 U.S.C. 154(b) by 0 days.

(21) Appl. No.: 18/983,501

(22) Filed: Dec. 17, 2024

(65) Prior Publication Data

US 2025/0120186 A1 Apr. 10, 2025

(30) Foreign Application Priority Data

Dec. 19, 2023 (CN) ......................... 202311748852.4

(51) Int. Cl.

| | |
|---|---|
| ***H10F 10/174*** | (2025.01) |
| ***H10F 71/00*** | (2025.01) |
| ***H10F 71/10*** | (2025.01) |
| ***H10F 77/122*** | (2025.01) |
| ***H10F 77/164*** | (2025.01) |
| ***H10F 77/166*** | (2025.01) |
| ***H10F 77/30*** | (2025.01) |

(52) U.S. Cl.

CPC ......... *H10F 10/174* (2025.01); *H10F 71/103* (2025.01); *H10F 71/1221* (2025.01); *H10F 71/1224* (2025.01); *H10F 71/128* (2025.01); *H10F 71/131* (2025.01); *H10F 77/122* (2025.01); *H10F 77/1645* (2025.01); *H10F 77/1662* (2025.01); *H10F 77/315* (2025.01)

(58) Field of Classification Search

None

See application file for complete search history.

(56) References Cited

U.S. PATENT DOCUMENTS

| | | | | |
|---|---|---|---|---|
| 10,181,534 | B2 * | 1/2019 | Chung | H10F 10/146 |
| 2009/0223562 | A1 * | 9/2009 | Niira | H10F 10/146 257/E31.124 |
| 2011/0005575 | A1 * | 1/2011 | Cao | H10F 10/17 136/246 |

FOREIGN PATENT DOCUMENTS

| | | | |
|---|---|---|---|
| CN | 111063760 | A | 4/2020 |
| CN | 114497241 | A | 5/2022 |
| CN | 115513306 | A | 12/2022 |
| CN | 115513339 | A | 12/2022 |
| CN | 115732576 | A | 3/2023 |

(Continued)

OTHER PUBLICATIONS

Machine translation of CN115513306A (Year: 2022).*

(Continued)

*Primary Examiner* — Tamir Ayad

(74) *Attorney, Agent, or Firm* — Taft, Stettinius & Hollister LLP

(57) ABSTRACT

The present disclosure relates to a heterojunction solar cell, a manufacturing method thereof and a photovoltaic module. The heterojunction solar cell includes a substrate of a first conductivity type, a tunnel layer located on a light-receiving surface of the substrate, and a doped polysilicon layer located on a top surface of the tunnel layer. The doped polysilicon layer has the first conductivity type.

7 Claims, 2 Drawing Sheets

(56) References Cited

FOREIGN PATENT DOCUMENTS

| | | | |
|---|---|---|---|
| CN | 117038746 | A | 11/2023 |
| CN | 220121855 | U | 12/2023 |
| KR | 101626248 | B1 | 5/2016 |
| WO | 2023072164 | A1 | 5/2023 |

OTHER PUBLICATIONS

European Patent Office, Extended Search Report issued in corresponding Application No. 24221087.0, dated May 12, 2025, 9 pp.
Chinese Patent Office, Decision to Grant issued in corresponding Application No. 202311748852.4, dated Aug. 15, 2024, 4 pp.
Australian Patent Office, Notice of Acceptance issued in corresponding Application No. 2024278570, dated Dec. 16, 2025, 3 pp.

* cited by examiner

HETEROJUNCTION SOLAR CELL AND MANUFACTURING METHOD THEREOF, AND PHOTOVOLTAIC MODULE

CROSS-REFERENCE TO RELATED APPLICATION

This application claims priority to Chinese Patent Application No. 202311748852.4, filed Dec. 19, 2023 and titled "HETEROJUNCTION SOLAR CELL AND MANUFACTURING METHOD THEREOF, AND PHOTOVOLTAIC MODULE," the contents of which is hereby incorporated herein in its entirety by reference.

TECHNICAL FIELD

The present disclosure relates to the technical field of solar cells, particularly to a heterojunction solar cell, a manufacturing method thereof and a photovoltaic module.

BACKGROUND

Heterojunction (HJT) solar cells, also called crystalline silicon heterojunction solar cells, have a series of advantages, such as high conversion efficiency, streamlined manufacturing processes, and being compatible with thin silicon wafers. Compared with other types of solar cells, the amorphous silicon/microcrystalline silicon layers, which form the heterojunctions in the HJT solar cell, are more susceptible to damage from ultraviolet (UV) radiation, which results in surface defects. Consequently, the degradation of HJT solar cells occurs more rapidly, leading to decline in photovoltaic conversion efficiency of a photovoltaic module composed of the HJT solar cells.

SUMMARY

Embodiments of the present disclosure provide a heterojunction solar cell, a manufacturing method thereof and a photovoltaic module.

An embodiment of the present disclosure provides a heterojunction solar cell, including:

- a substrate of a first conductivity type;
- a tunnel layer located on a light-receiving surface of the substrate; and
- a doped polysilicon layer located on a top surface of the tunnel layer, the doped polysilicon layer having the first conductivity type.

In an embodiment, the heterojunction solar cell further includes:

- a front surface field layer located on the light-receiving surface, the front surface field layer having the first conductivity type;
- wherein the tunnel layer is located on a top surface of the front surface field layer.

In an embodiment, the tunnel layer includes a tunnel oxide layer.

In an embodiment, the heterojunction solar cell further includes:

- a passivation anti-reflection layer located on the doped polysilicon layer; and
- a first electrode penetrating through the passivation anti-reflection layer and electrically connected to the doped polysilicon layer.

In an embodiment, the first electrode includes:

- a lead-out electrode extending from a top surface of the passivation anti-reflection layer into the passivation anti-reflection layer; and
- a contact layer, a top surface of the contact layer being in contact with a bottom surface of the lead-out electrode, and a bottom surface of the contact layer being in contact with the doped polysilicon layer.

In an embodiment, the contact layer includes:

- a first sub-contact layer located between the lead-out electrode and the doped polysilicon layer; and
- a second sub-contact layer located on the passivation anti-reflection layer, the second sub-contact layer being integrated with the first sub-contact layer.

In an embodiment, the heterojunction solar cell further includes:

- an intrinsic amorphous silicon layer located on a shadowed surface of the substrate, the shadowed surface being opposite to the light-receiving surface;
- a doped semiconductor back layer located on a top surface of the intrinsic amorphous silicon layer; and
- an electrically conductive back layer located on a top surface of the doped semiconductor back layer;
- wherein a material of the doped semiconductor back layer includes at least one of a doped amorphous silicon material, a doped nanocrystalline silicon material, and a doped microcrystalline silicon material.

An embodiment of the present disclosure further provides a method for manufacturing a heterojunction solar cell, including:

- providing a substrate of a first conductivity type;
- forming a tunnel layer on a light-receiving surface of the substrate; and
- forming a doped polysilicon layer on a top surface of the tunnel layer, the doped polysilicon layer having the first conductivity type.

In an embodiment, forming the doped polysilicon layer on the top surface of the tunnel layer includes:

- forming a doped semiconductor layer of the first conductivity type on the top surface of the tunnel layer through an in-situ doping process, wherein a material of the doped semiconductor layer includes at least one of doped amorphous silicon and doped polysilicon; and
- annealing the doped semiconductor layer to crystallize the doped semiconductor layer into the doped polysilicon layer, and to introduce doping ions from the doped semiconductor layer into an upper surface layer of the substrate to form a front surface field layer of the first conductivity type.

In an embodiment, annealing the doped semiconductor layer includes:

- annealing the doped semiconductor layer in a process gas including an oxidizing gas, thereby forming a mask material layer on a top surface of the doped polysilicon layer;
- the method further includes:
- patterning the mask material layer to form a mask pattern layer; and
- etching the doped polysilicon layer and the tunnel layer through the mask pattern layer as a mask, thereby retaining portions of the doped polysilicon layer and the tunnel layer covered by the mask pattern layer as a stacked structure.

In an embodiment, after forming the doped polysilicon layer on the top surface of the tunnel layer, the method further includes:

- forming a passivation anti-reflection layer on the doped polysilicon layer; and forming a first electrode penetrating through the passivation anti-reflection layer on the passivation anti-reflection layer, thereby electrically connecting the first electrode to the doped polysilicon layer.

In an embodiment, forming the first electrode penetrating through the passivation anti-reflection layer on the passivation anti-reflection layer includes:

forming a first filling groove in the passivation anti-reflection layer, thereby exposing the doped polysilicon layer through the first filling groove; and forming the first electrode by filling the first filling groove.

In an embodiment, the first electrode includes a contact layer and a lead-out electrode, and forming the first electrode by filling the first filling groove includes:

forming the contact layer in a bottom of the first filling groove to contact the doped polysilicon layer; and forming the lead-out electrode in the first filling groove to contact a top surface of the contact layer.

In an embodiment, forming the contact layer in the bottom of the first filling groove to contact the doped polysilicon layer includes:

forming the contact layer in contact with the doped polysilicon layer on an inner wall of the first filling groove, wherein the contact layer extends along the inner wall of the first filling groove onto the passivation anti-reflection layer to cover the passivation anti-reflection layer.

In an embodiment, forming the doped polysilicon layer on the top surface of the tunnel layer includes:

forming an intrinsic semiconductor layer on the top surface of the tunnel layer, wherein a material of the intrinsic semiconductor layer includes at least one of intrinsic amorphous silicon and intrinsic polysilicon; and introducing doping ions of the first conductivity type into the intrinsic semiconductor layer through a diffusion process to form the doped polysilicon layer.

In an embodiment, introducing the doping ions of the first conductivity type into the intrinsic semiconductor layer through the diffusion process further includes:

introducing the doping ions into an upper surface layer of the substrate to form a front surface field layer of the first conductivity type.

A heterojunction solar cell is manufactured by the above-described method.

A photovoltaic module includes a plurality of above-described heterojunction solar cells.

BRIEF DESCRIPTION OF THE DRAWINGS

In order to more clearly describe the embodiments of the present disclosure, the accompanying drawings to be used in the description of the embodiments will be described briefly. Obviously, the drawings described below are only for some embodiments of the present disclosure. For ordinary skilled persons in the art, other drawings can also be obtained based on the following drawings without creative work.

REFERENCE SIGNS

Figure 1:
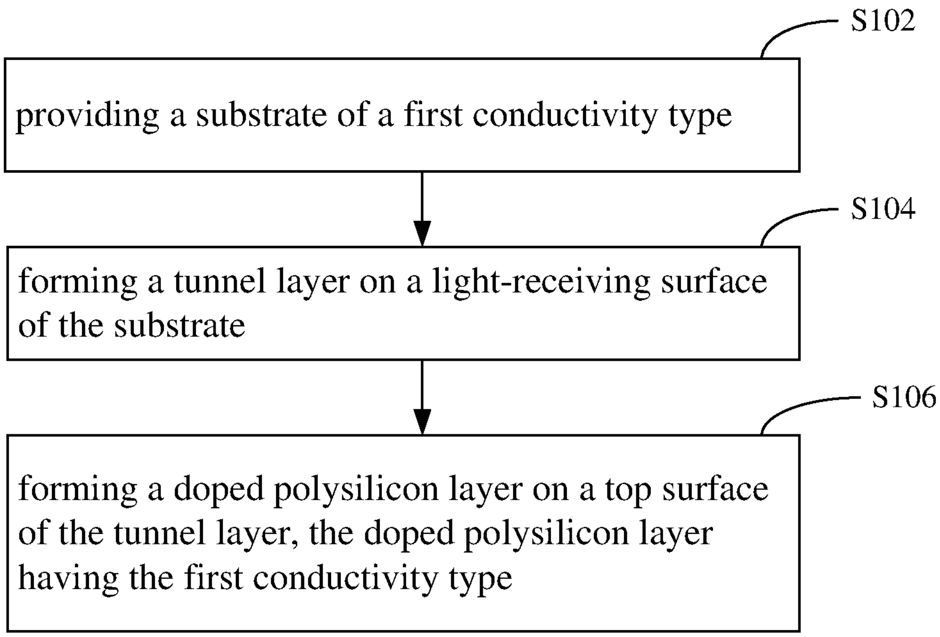
FIG. 1 is a flow chart of a method for manufacturing a heterojunction solar cell according to an embodiment of the present disclosure.

102—substrate; 104—tunnel layer; 106—doped polysilicon layer; 108—front surface field layer; 110—mask material layer; 112—passivation anti-reflection layer; 114—intrinsic semiconductor layer; 116—doped semiconductor back layer; 118—first electrode; 120—contact layer; 122—lead-out electrode; 124—electrically conductive back layer; 126—second electrode; 202—stacked structure; 204—first filling groove.

DETAILED DESCRIPTION

In order to facilitate the understanding of the present disclosure, the present disclosure will be comprehensively described with reference to the drawings. Embodiments of the present disclosure are shown in the accompanying drawings. However, the present disclosure can be implemented in many different forms and therefore is not limited to the embodiments described herein. On the contrary, the purpose of providing these embodiments is to make the understanding of the present disclosure more thorough and comprehensive.

Unless defined otherwise, all technical and scientific terms used herein have the same meaning as commonly understood by those skilled in the art to which the present disclosure belongs. The terms used in the specification of the present disclosure are for the purpose of describing exemplary examples only and are not intended to limit the present disclosure.

It should be understood that when an element or layer is referred to as being "on", "adjacent to", "connected to", or "coupled to" another element or layer, it can be directly on, adjacent to, connected to, or coupled to the other element or layer, or an intermediate element or layer can be present. In contrast, when an element is referred to as being "directly on", "directly adjacent to", "directly connected to", or "directly coupled to" another element or layer, there is no intermediate element or layer. It can be understood that although the terms first, second, third, etc. may be used to describe various elements, components, regions, layers, doping types, and/or sections, these elements, components, regions, layers, doping types, and/or sections should not be limited by these terms. These terms are only used to distinguish one element, component, region, layer, doping type, or section from another element, component, region, layer, doping type, or section. Thus, a first element, component, region, layer, doping type, or section described below can be termed as a second element, component, region, layer, doping type, or section without departing from the teachings of the present application. For example, a first doping type can be referred to as a second doping type, and similarly, a second doping type can be referred to as a first doping type. The first doping type and second doping type are different doping types, e.g., the first doping type can be p-type and the second doping type can be n-type, or the first doping type can be n-type and the second doping type can be p-type.

The spatial relation terms such as “below”, “under”, “beneath”, “above”, “on”, “over”, etc., may be used herein to describe the relationships of an element or a feature with other elements or features shown in the drawings. It should be understood that the terms of spatial relations are intended to include other different orientations in use or operation in addition to the orientation of the elements or features shown in the drawings. For example, if the device shown in the drawings are placed upside down, the element or feature which was “below”, “under”, or “beneath” other elements or features will be “above” or “over” the other elements or features. Thus, the exemplary terms “below”, “under”, and “beneath” may cover the orientations of above and below. The device can also be positioned in other different orientations (e.g., rotating 90 degrees or at other orientations), and the spatial relation terms used herein can be correspondingly interpreted.

As used herein, the singular forms with “a”, “an”, “the”, or “said” are intended to include the plural forms as well, unless the context clearly indicates otherwise. It should also be understood that the terms “be composed of” and/or “include”, when used in the present disclosure, identify the presence of the stated features, integers, steps, operations, elements and/or parts, but do not exclude presence or addition of one or more other features, integers, steps, operations, elements, parts and/or groups. As used herein, the term “and/or” means that any or all combinations of the listed items can be employed.

The embodiments of the present disclosure are described herein with reference to drawings showing cross-sectional views of idealized embodiments (and intermediate structures) of the present disclosure, which are schematic views. It can be expected that some variations of the shown shapes may exist due to, for example, manufacturing techniques and/or engineering tolerances. Thus, embodiments of the present disclosure should not be limited to the particular shapes of the regions shown herein but include deviations in shapes due to, for example, manufacturing techniques. For example, an injection region shown as rectangular typically has rounded or curved features at its edges and/or an injection concentration gradient, rather than a binary change from the injection region to the non-injection region. Similarly, buried regions formed by injection may result in some injection within the region between the buried region and the surface traversed during the injection process. Thus, the regions shown in the drawings are schematic in nature, and their shapes are not intended to be the actual shapes of the regions of the device or limit the scope of the present disclosure.

In the present disclosure, the upper surface of the substrate is the light-receiving surface that receives solar radiation, and the lower surface of the substrate is the surface opposite to the upper surface of the substrate. For structures or layers located in the substrate, in the two surfaces thereof parallel to the upper or lower surface of the substrate, the surface adjacent to the upper surface of the substrate is referred to as an upper surface/top surface/top/top face, and the surface away from the upper surface of the substrate is referred to as a lower surface/bottom surface/bottom/bottom face. In contrast, for structures or layers located on the substrate, in the two surfaces thereof, the surface adjacent to the upper or lower surface of the substrate is referred to as the lower surface/bottom surface/bottom/bottom face, and the surface away from the upper or lower surface of the substrate is referred to as the upper surface/top surface/top/top face.

The conventional HJT solar cell has a symmetrical bifacial cell structure with n-type monocrystalline silicon in the middle. An intrinsic amorphous silicon layer and an n-type amorphous or microcrystalline silicon layer are sequentially deposited on the front side of the n-type monocrystalline silicon, thus forming a front surface field. An intrinsic amorphous silicon layer and a p-type amorphous or microcrystalline silicon layer are sequentially deposited on the back side of the n-type monocrystalline silicon, thus forming a p-n junction. However, in the above structure of the HJT solar cell, the amorphous silicon/microcrystalline silicon layers on the front side are susceptible to damage from UV radiation, which results in surface defects, thus causing rapid degradation in photovoltaic conversion efficiency of the HJT solar cell, and leading to rapid degradation in photovoltaic conversion efficiency of the photovoltaic module including the HJT solar cells.

To address the issue that the amorphous silicon/microcrystalline silicon layers on the light-receiving surface of the HJT solar cell are susceptible to damage from UV radiation, which results in surface defects, one solution is to reduce the thickness of the amorphous silicon/microcrystalline silicon layers in the HJT solar cell. However, this approach does not effectively resolve the problem of UV radiation damage to the amorphous silicon/microcrystalline silicon layers, still leading to the photoelectric conversion efficiency degradation issue. Another solution is to incorporate a UV cutoff film or a UV light conversion film during encapsulating the HJT solar cells into a photovoltaic module. Nonetheless, this approach faces issues such as decreased electrical performance of the photovoltaic module, yellowing of the encapsulant, and increased costs.

Figure 2:
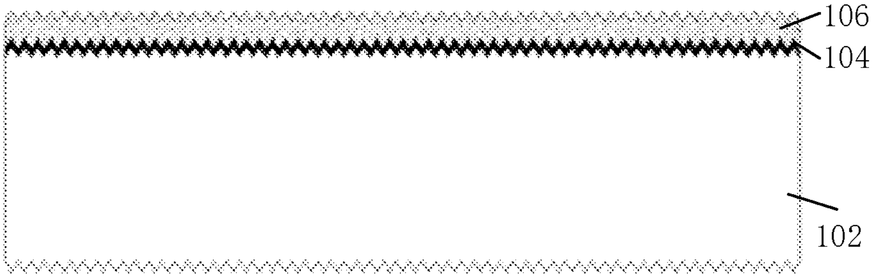
FIG. 2 is a schematic cross-sectional view of a heterojunction solar cell after forming a doped polysilicon layer according to an embodiment of the present disclosure.

FIG. 1 is a flow chart of a method for manufacturing a heterojunction solar cell according to an embodiment of the present disclosure. FIG. 2 is a schematic cross-sectional view of a heterojunction solar cell after forming a doped polysilicon layer according to an embodiment of the present disclosure. Referring to FIGS. 1 and 2, an embodiment of the present disclosure provides a method for manufacturing a heterojunction solar cell, which includes S102 to S106:

S102: Providing a substrate of a first conductivity type.

The substrate 102 of the first conductivity type is provided, wherein the substrate 102 includes a light-receiving surface and a shadowed surface opposite to the light-receiving surface. The light-receiving surface is corresponding to the surface of the heterojunction solar cell that faces the sunlight (i.e., light-facing surface), and the shadowed surface is the surface of the substrate 102 opposite to the light-receiving surface. It can be understood that minor light can also irradiate the shadowed surface, and the light-receiving surface is just a major surface for receiving light. The shadowed surface can also be called back surface. The light-receiving surface can also be called front surface. The first conductivity type can be either n-type or p-type. The substrate 102 can be selected from semiconductor substrates made of a material such as silicon or germanium, or semiconductor substrates made of compounds, such as silicon carbide, silicon-germanium, gallium arsenide, indium phosphide, zinc oxide, or gallium oxide. For example, in an embodiment, the substrate 102 is made of monocrystalline silicon.

For example, the thickness of the substrate 102 can be in a range from 80 μm to 250 μm (e.g., can be 80 μm, 100 μm, 120 μm, 140 μm, 150 μm, 180 μm, 200 μm, 220 μm, 250 μm, etc.), optionally from 100 μm to 200 μm.

Specifically, after providing the substrate 102, a texturing process can be performed to remove damaged layers from the light-receiving surface and the shadowed surface of the substrate 102, obtaining a light-receiving surface and a shadowed surface both having textured surface structures. The textured surface structures can be pyramid textured surface structures, inverted-pyramid textured surface structures, etched pit textured surface structures, or any combinations thereof, addressing the issue of high reflectivity on the light-receiving surface and/or the shadowed surface when exposed to light, and further increasing the short-circuit current of the heterojunction solar cell. Then, the light-receiving surface or the shadowed surface of the substrate can be cleaned to remove organic or metal ion contaminations. The cleaning process can include alkaline cleaning, acid cleaning, and water rinsing. The alkaline cleaning solution can include an alkaline agent (e.g., KOH, NaOH, or tetramethylammonium hydroxide (TMAH)), $H_2O_2$, and deionized water. The acid cleaning solution can include an acidic agent (HCl, $H_2SO_4$, or HF), $H_2O_2$, and deionized water.

For example, the process solution adopted in the texturing process includes a texturing additive, an alkaline agent (e.g., KOH, NaOH, or TMAH), and deionized water, such as a KOH solution with a mass concentration of 5.5% to 6.5%. The process temperature of the texturing process can be in a range from 40° C. to 90° C., for example, 40° C., 50° C., 60° C., 70° C., 75° C., 90° C., etc.

S104: Forming a tunnel layer on the light-receiving surface of the substrate.

The tunnel layer 104 is formed on the light-receiving surface of the substrate 102 to form the surface passivation contact, which reduces surface recombination of charge carriers and ensures open-circuit voltage and photoelectric conversion efficiency of the heterojunction solar cell. For example, the tunnel layer 104 includes a tunnel oxide layer to enable effective tunneling of majority carriers. The tunnel layer 104 can be formed on the light-receiving surface by using wet oxidation, thermal oxidation, and/or plasma-enhanced chemical vapor deposition (PECVD).

For example, the thickness of the tunnel layer 104 can be in a range from 0.5 nm to 3 nm (e.g., 0.5 nm, 1 nm, 1.5 nm, 2 nm, 2.5 nm, 3 nm, etc.). By limiting the thickness of the tunnel layer 104 within the above range, the passivation contact effect of the tunnel layer 104 can be further ensured. In the embodiments of the present disclosure, the specific type of the tunnel layer 104 is not specifically limited, and those skilled in the art may choose according to actual needs. As some specific examples, the tunnel layer 104 can be made of silicon oxide and/or aluminum oxide.

S106: Forming a doped polysilicon layer on a top surface of the tunnel layer, the doped polysilicon layer having the first conductivity type.

The doped polysilicon layer 106 is formed on a surface of the tunnel layer 104 away from the substrate 102, i.e., on the top surface of the tunnel layer 104. The conductivity type of the doped polysilicon layer 106 is the same as that of the substrate 102. The doped polysilicon layer 106 achieves selective conduction of first conductivity-type carriers, resulting in a relatively high open-circuit voltage of the heterojunction solar cell.

The doped amorphous or microcrystalline silicon layer contains a large number of silicon-hydrogen bonds, which are prone to breakage under UV radiation. Therefore, the doped amorphous or microcrystalline silicon layer is more susceptible to damage from UV radiation, which results in surface defects. In contrast, the doped polysilicon layer 106 contains a large number of silicon-silicon bonds, which are more stable and less likely to break under UV radiation. As a result, when the tunnel layer 104 and the doped polysilicon layer 106 on the light-receiving surface of the heterojunction solar cell are exposed to sunlight, they are less likely to be damaged by UV radiation, which reduces the impact of UV radiation on the light-receiving surface of the heterojunction solar cell, alleviating the degradation of the photoelectric conversion efficiency and improving the photoelectric conversion efficiency of the heterojunction solar cell.

In the above-described method for manufacturing the heterojunction solar cell, the tunnel layer 104 and the doped polysilicon layer 106, instead of the amorphous silicon/microcrystalline silicon layers which form the heterojunction on the front side of the conventional heterojunction solar cell, are sequentially formed on the light-receiving surface of the substrate 102, which reduces the damage, caused by UV radiation, to the light-receiving surface of the heterojunction solar cell, thereby alleviating the degradation of the photoelectric conversion efficiency and improving the efficiency of the heterojunction solar cell.

Figure 3:
FIG. 3 is a schematic cross-sectional view of a heterojunction solar cell after forming a front surface field layer according to an embodiment of the present disclosure.

FIG. 3 is a schematic cross-sectional view of a heterojunction solar cell after forming a front surface field layer according to an embodiment of the present disclosure. Referring to FIG. 3, in an embodiment, forming the doped polysilicon layer 106 on the top surface of the tunnel layer 104 includes: forming a doped semiconductor layer of the first conductivity type on the top surface of the tunnel layer 104 through an in-situ doping process, wherein a material of the doped semiconductor layer can include at least one of doped amorphous silicon and doped polysilicon; annealing the doped semiconductor layer to crystallize the doped semiconductor layer into the doped polysilicon layer 106, and to introduce doping ions from the doped semiconductor layer into an upper surface layer of the substrate 102 to form a front surface field layer 108 of the first conductivity type.

When the doped semiconductor layer includes doped amorphous silicon, the doped amorphous silicon can be crystallized through the annealing process to form the doped polysilicon layer 106. When the doped semiconductor layer includes doped polysilicon, the annealing process allows non-crystalline silicon in the doped polysilicon to crystallize, eliminating defects in the doped polysilicon layer 106, thereby achieving high performance of the doped polysilicon layer 106. The doping ions are of the first conductivity type. The in-situ doping process can form a semiconductor layer doped with the doping ions in one step, eliminating the need for a separate doping step, thereby improving manufacturing efficiency and reducing costs, and enabling the subsequently formed doped polysilicon layer 106 to have a more uniform distribution of doping ions. The upper surface layer of the substrate 102 is the part of the substrate 102 that is adjacent to the tunnel layer 104. During annealing the doped semiconductor layer to crystallize the doped semiconductor layer into the doped polysilicon layer 106, the first conductivity-type doping ions in the doped semiconductor layer diffuse into the upper surface layer of the substrate 102, forming a doped diffusion layer of the first conductivity type. This doped diffusion layer, which is the front surface field layer 108, reduces surface recombination of charge carriers and has a surface field effect. During annealing to form the doped polysilicon layer 106, the doping ions also diffuse into the upper surface layer of the substrate 102 to form the front surface field layer 108, eliminating the need for a separate step for forming the front surface field layer 108, thereby simplifying the process flow for manufacturing the heterojunction solar cell and reducing manufacturing costs. The front surface field layer 108 can reduce surface recombination of charge carriers and increase the open-circuit voltage and photoelectric conversion efficiency of the heterojunction solar cell. It can be understood that the doping ions in the doped polysilicon layer 106 and the doping ions in the substrate 102 can be the same or different. The n-type doping ions can be selected from pentavalent ions of impurity elements such as phosphorus, arsenic, etc., and the p-type doping ions can be selected from trivalent ions of impurity elements such as boron, gallium, etc. The annealing temperature can be, but is not limited to, 800° C. to 950° C.

In some embodiments, the thickness of the front surface field layer 108 can be in a range from 0.001 μm to 5 μm (e.g., 0.001 μm, 0.005 μm, 0.01 μm, 0.5 μm, 1 μm, 1.5 μm, 2 μm, 5 μm, etc.) By limiting the thickness of the front surface field layer 108 within the above range, the front surface field layer 108 can reduce surface recombination of charge carriers while the raw material consumption for forming the front surface field layer 108 can be reduced, thereby lowering the manufacturing costs.

In some embodiments, the sheet resistance of the front surface field layer 108 can be in a range from 10 Ohm/sq to 10,000 Ohm/sq (e.g., 10 Ohm/sq, 50 Ohm/sq, 100 Ohm/sq, 150 Ohm/sq, 200 Ohm/sq, 250 Ohm/sq, 300 Ohm/sq, 350 Ohm/sq, 400 Ohm/sq, 450 Ohm/sq, 500 Ohm/sq, 10,000 Ohm/sq, etc.). By limiting the sheet resistance of the front surface field layer 108 within the above range, surface recombination of charge carriers can be further reduced, thereby further increasing the open-circuit voltage and photoelectric conversion efficiency of the heterojunction solar cell.

In some embodiments, the thickness of the doped polysilicon layer 106 can be in a range from 1 nm to 500 nm (e.g., 1 nm, 5 nm, 10 nm, 100 nm, 200 nm, 300 nm, 400 nm, 500 nm, etc.). By limiting the thickness of the doped polysilicon layer 106 within the above range, both good passivation contact and carrier-selective characteristics can be achieved while surface recombination of charge carriers can be reduced. Additionally, the doped polysilicon layer 106 with the thickness in the above range can further reduce the damage to the light-receiving surface of the heterojunction solar cell caused by UV radiation, thereby decreasing the degradation of the photoelectric conversion efficiency of the heterojunction solar cell. Moreover, the doped polysilicon layer 106 with the thickness in the above range can further reduce the light absorption loss on the front surface of the heterojunction solar cell, thereby increasing the short-circuit current and photoelectric conversion efficiency of the heterojunction solar cell.

Figure 4:
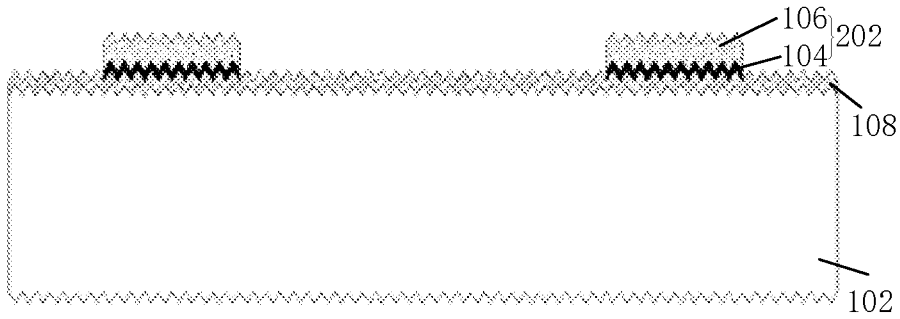
FIG. 4 is a schematic cross-sectional view of a heterojunction solar cell after forming a stacked structure according to an embodiment of the present disclosure.

FIG. 4 is a schematic cross-sectional view of a heterojunction solar cell after forming a stacked structure according to an embodiment of the present disclosure. Referring FIGS. 3 and 4, in an embodiment, annealing the doped semiconductor layer includes: annealing the doped semiconductor layer in a process gas including an oxidizing gas, thereby forming a mask material layer 110 on a top surface of the doped polysilicon layer 106. The oxidizing gas can include oxygen gas, water, ozone gas, or any combinations thereof. The material of the mask material layer 110 can include an oxide doped with doping ions, such as phosphosilicate glass (PSG, when the first conductivity type is n-type) or borosilicate glass (BSG, when the first conductivity type is p-type). The method for manufacturing the heterojunction solar cell further includes steps S202 to S204.

S202: Patterning the mask material layer 110 to form a mask pattern layer.

Specifically, the light-receiving surface of the substrate 102 can be divided into a metal contact region where a first electrode is located and a non-metal contact region outside the metal contact region. The metal contact region has a size larger than or equal to a size of the first electrode, such that an orthographic projection of the first electrode on the substrate 102 can be entirely located in the metal contact region of the light-receiving surface. The mask material layer 110 is patterned to form the mask pattern layer. The mask pattern layer is located corresponding to the metal contact region. The width of the mask pattern layer is greater than or equal to the width of the first electrode, and the width direction of the mask pattern layer intersects the extension direction of the first electrode. In an embodiment, the width direction of the mask pattern layer is perpendicular to the extension direction of the first electrode. During the annealing process to obtain the doped polysilicon layer 106, the upper surface of the doped polysilicon layer 106 can be further oxidized to form the mask material layer 110, eliminating the need for a separate step to form the mask material layer 110, thereby simplifying the process flow of the heterojunction solar cell and reducing the manufacturing costs.

In some embodiments, laser ablation can be adopted to remove the mask material layer 110 in the non-metallic contact region, leaving the mask pattern layer composed of the remaining portion of the mask material layer 110. Alternatively, an acid-resistant protecting ink or slurry can be printed onto the mask material layer 110. The portion of the mask material layer 110 which is not covered by the protecting ink or slurry can be removed in an HF solution, achieving the mask pattern layer composed of the remaining portion of the mask material layer 110. Then the protecting ink or slurry can be removed from the mask pattern layer by using an alkaline solution.

S204: etching the doped polysilicon layer 106 and the tunnel layer 104 through the mask pattern layer as a mask, thereby retaining the portions of the doped polysilicon layer 106 and the tunnel layer 104 covered by the mask pattern layer as a stacked structure 202.

Specifically, the exposed portions of the doped polysilicon layer 106 and the tunnel layer 104 can be removed through an etching process (e.g., wet etching) using the mask pattern layer as a mask, resulting in a stacked structure 202 formed by the remaining portions of the doped polysilicon layer 106 and the tunnel layer 104. The subsequently formed first electrode is located on a top of the stacked structure 202. The stacked structure 202 only covers the metal contact region, reducing the area of the light-receiving surface covered by the doped polysilicon layer 106, which reduces the light absorption loss on the light-receiving surface of the heterojunction solar cell while maintaining the passivation contact effect, thereby further increasing the short-circuit current and photoelectric conversion efficiency of the solar cell. The method for forming the stacked structure 202 is simple and cost-effective.

In an embodiment, after forming the stacked structure 202, the method further includes: removing the mask pattern layer. Specifically, a cleaning solution containing HF can be applied to remove the mask pattern layer, and then alkaline cleaning and acid cleaning or RCA cleaning can be applied to remove organic contaminations and metal ion contaminations from the surface of the substrate 102.

In an embodiment, forming the doped polysilicon layer 106 on the top surface of the tunnel layer 106 includes steps S302 to S304.

S302: forming an intrinsic semiconductor layer on the top surface of the tunnel layer 104, wherein a material of the intrinsic semiconductor layer includes at least one of intrinsic amorphous silicon and intrinsic polysilicon.

The intrinsic semiconductor layer is formed on a surface away from the substrate 102 (i.e., the top surface) of the tunnel layer 104 by using a chemical vapor deposition process, such as low pressure chemical vapor deposition (LPCVD) or plasma enhanced chemical vapor deposition (PECVD). The material of the intrinsic semiconductor layer includes at least one of intrinsic amorphous silicon and intrinsic polysilicon. Specifically, the material of the intrinsic semiconductor layer can be intrinsic amorphous silicon; or the material of the intrinsic semiconductor layer can be intrinsic polysilicon; or the material of the intrinsic semiconductor layer can be a mixture of intrinsic amorphous silicon and intrinsic polysilicon.

S304: Introducing doping ions of the first conductivity type into the intrinsic semiconductor layer through a diffusion process to form the doped polysilicon layer 106.

Though the diffusion process, which can include a heating step, doping ions of the first conductivity type are diffused into the intrinsic semiconductor layer, forming a doped semiconductor layer. In an embodiment, a doping source layer can be previously formed on the intrinsic semiconductor layer, and the dopant in ion form can diffuse from the doping source layer into the intrinsic semiconductor layer during the heating step. In another embodiment, the intrinsic semiconductor layer can be heated in an atmosphere including a dopant source gas, and the dopant in ion form can diffuse from the atmosphere into the intrinsic semiconductor layer during the heating step. The heating temperature is not limited provided that the doping ions can diffuse into the intrinsic semiconductor layer. The heating temperature can be, but is not limited to, 800° C. to 950° C. When the material of the intrinsic semiconductor layer includes intrinsic amorphous silicon, during the diffusion process, the intrinsic amorphous silicon layer is doped while crystallized, and thus the intrinsic semiconductor layer is transformed into the doped polysilicon layer 106 doped with the doping ions of the first conductivity type. When the material of the intrinsic semiconductor layer only includes intrinsic polysilicon, during the diffusion process, the doping ions diffuse into the intrinsic semiconductor layer to achieve the doped polysilicon layer 106.

In an embodiment, introducing the doping ions of the first conductivity type into the intrinsic semiconductor layer through the diffusion process further includes: introducing the doping ions of the first conductivity type into an upper surface layer of the substrate 102 to form a front surface field layer 108, which is the upper surface layer of the substrate doped with the doping ions. Specifically, in the diffusion process, a portion of the doping ions of the first conductivity type can, under the influences of temperature and ion concentration gradient, pass through the tunnel layer 104 and enter the upper surface layer of the substrate 102, forming a doped diffusion layer of the first conductivity type. This doped diffusion layer, which is the front surface field layer 108, reduces surface recombination of charge carriers and has a surface field effect, as that in the previous embodiments. The diffusion process can form the front surface field layer 108 with high sheet resistance and low surface recombination, eliminating the need for a separate step for forming the front surface field layer 108, thereby simplifying the process flow for manufacturing the heterojunction solar cell and reducing manufacturing costs.

It can be understood that, an oxidizing gas can be introduced during the diffusion process. During the diffusion of the doping ions of the first conductivity type into the intrinsic semiconductor layer, the surface of the intrinsic semiconductor layer can be oxidized to form a silicon oxide layer doped with the doping ions of the first conductivity type. This silicon oxide layer can serve as the mask material layer 110 described in the previous embodiments, which will not be repeatedly described herein. The oxidizing gas adopted herein can be the same as or different from the oxidizing gas adopted in the annealing process of the previous embodiments.

Figure 5:
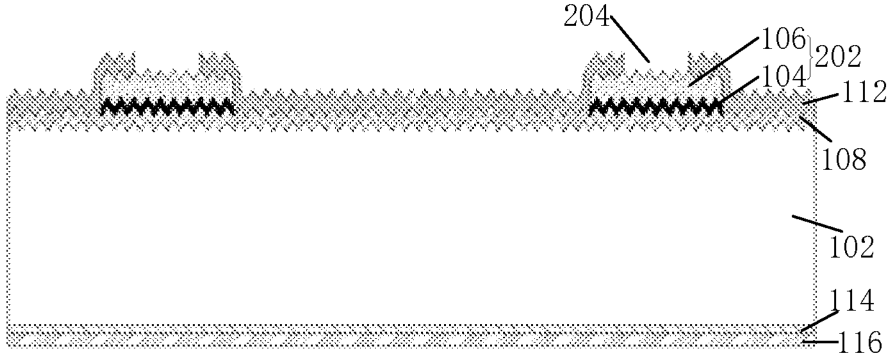
FIG. 5 is a schematic cross-sectional view of a heterojunction solar cell after forming a first filling groove based on an embodiment as shown in FIG. 4.
Figure 6:
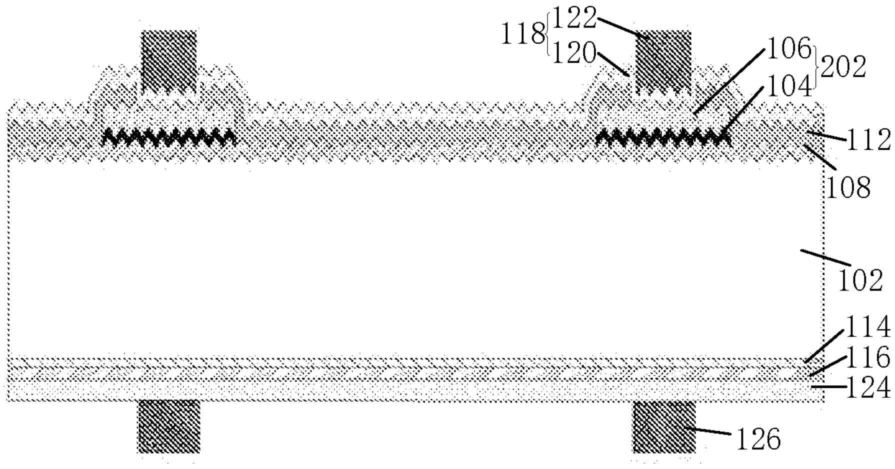
FIG. 6 is a schematic cross-sectional view of a heterojunction solar cell after forming a first electrode based on an embodiment as shown in FIG. 5.

FIG. 5 is a schematic cross-sectional view of a heterojunction solar cell after forming a first filling groove based on an embodiment as shown in FIG. 4. FIG. 6 is a schematic cross-sectional view of a heterojunction solar cell after forming a first electrode based on an embodiment as shown in FIG. 5. Referring to FIGS. 5 and 6, in an embodiment, after forming the doped polysilicon layer 106 on the top surface of the tunnel layer 104, the method further includes steps S402 to S404.

S402: Forming a passivation anti-reflection layer 112 on the doped polysilicon layer 106.

Specifically, the passivation anti-reflection layer 112 is formed on the doped polysilicon layer 106. The passivation anti-reflection layer 112 can reduce the light reflection loss on the light-receiving surface of the heterojunction solar cell, thereby increasing the photogenerated current, and thus improving the photovoltaic conversion efficiency of the heterojunction solar cell. Additionally, the passivation anti-reflection layer 112 also provides protection and passivation to the solar cell. It can be understood that in a case where the doped polysilicon layer 106 and the tunnel layer 104 are not patterned, the passivation anti-reflection layer 112 are formed on the surface of the doped polysilicon layer 106. Alternatively, in a case where the doped polysilicon layer 106 and the tunnel layer 104 are patterned to form the stacked structure 202, the passivation anti-reflection layer 112 is formed on the top surface of the stacked structure 202 and extends along the sidewalls of the stacked structure 202 onto and cover the exposed surface of the front surface field layer 108.

For example, the passivation anti-reflection layer 112 can be formed on the doped polysilicon layer 106 by using a chemical vapor deposition process, such as low pressure chemical vapor deposition (LPCVD) or plasma enhanced chemical vapor deposition (PECVD). The thickness of the passivation anti-reflection layer 112 can be in a range from 20 nm to 200 nm, e.g., 20 nm, 50 nm, 60 nm, 70 nm, 80 nm, 90 nm, 100 nm, 110 nm, 120 nm, 130 nm, 140 nm, 150 nm, 170 nm, and 200 nm. By controlling the thickness of the passivation anti-reflection layer 112 within the above range, the light absorption loss on the light-receiving surface of the heterojunction solar cell can be reduced, while saving materials and reducing costs. The material of the passivation anti-reflection layer 112 can include, but is not limited to, at least one of aluminum oxide, silicon oxide, silicon nitride, silicon oxynitride, silicon carbide, magnesium fluoride, indium tin oxide, aluminum zinc oxide, hydrogen-doped indium oxide, and indium tungsten oxide.

In some embodiments, the method for manufacturing the heterojunction solar cell further includes sequentially forming an intrinsic amorphous silicon layer 114 and a doped semiconductor back layer 116 on the shadowed surface of the substrate 102. The doped semiconductor back layer 116 has a second conductivity type. The doped semiconductor back layer 116 is located on the surface of the intrinsic amorphous silicon layer 114 away from the substrate 102, i.e., on the top surface of the intrinsic amorphous silicon layer 114. The second conductivity type is opposite to the first conductivity type. When the first conductivity type is p-type, the second conductivity type is n-type. When the first conductivity type is n-type, the second conductivity type is p-type. The intrinsic amorphous silicon layer 114 passivates the shadowed surface of the substrate 102, while the p-n junction is formed between the doped semiconductor back layer 116 and the substrate 102, resulting in the heterojunction solar cell.

Specifically, the shadowed surface of the substrate 102 can be subjected to a hydrophobization treatment and/or a wrapping-removal treatment to remove the materials of the passivation anti-reflection layer 112, the front surface field layer 108, the tunnel layer 104, the doped polysilicon layer 106, and other layers wrapped around the shadowed surface. Alternatively or additionally, the shadowed surface can be polished to form a polished surface or textured once again to form a textured surface structure. The morphology of the shadowed surface can be the same as or different from that of the light-receiving surface. The polishing solution can include an alkaline reagent (KOH, NaOH, or TMAH), a polishing additive, and deionized water. The texturing solution can include an alkaline reagent (KOH, NaOH, or TMAH), a texturing additive, and deionized water. After that, the substrate 102 can be cleaned to remove organic contaminations and metal ion contaminations from the light-receiving surface or the shadowed surface, using cleaning processes that include alkaline cleaning, acid cleaning, and water rinsing. The alkaline cleaning solution can include an alkaline reagent (KOH, NaOH, or TMAH), $H_2O_2$, and deionized water. The acid cleaning solution can include an acidic agent (HCl, $H_2SO_4$, or HF), $H_2O_2$, and deionized water. The cleaning process does not remove the passivation anti-reflection layer 112. Subsequently, the intrinsic amorphous silicon layer 114 can be formed on the shadowed surface. In some embodiments, the thickness of the intrinsic amorphous silicon layer 114 is in a range from 1 nm to 15 nm, which ensures passivation contact effect of the intrinsic amorphous silicon layer 114 on the shadowed surface of the substrate 102 while saving costs. Then, the doped semiconductor back layer 116 can be formed on the surface of the intrinsic amorphous silicon layer 114 away from the substrate 102. The doped semiconductor back layer 116 can include a second conductivity type doped amorphous silicon back layer, a second conductivity type doped nanocrystalline silicon back layer, and/or a second conductivity type doped microcrystalline silicon back layer. In some embodiments, the material of the doped semiconductor back layer 116 includes at least one of a doped amorphous silicon material, a doped nanocrystalline silicon material, and a doped microcrystalline silicon material. For example, the material of the doped semiconductor back layer 116 can be the doped amorphous silicon material, the doped nanocrystalline silicon material, or the doped microcrystalline silicon material, or can be stacked layers of any two or three of the doped amorphous silicon material, the doped nanocrystalline silicon material, and the doped microcrystalline silicon material. The thickness of the doped semiconductor back layer 116 can be in a range from 1 nm to 15 nm.

S404: Forming a first electrode 118 penetrating through the passivation anti-reflection layer 112 on the passivation anti-reflection layer 112, thereby electrically connecting the first electrode 118 to the doped polysilicon layer 106.

In an embodiment, forming the first electrode 118 penetrating through the passivation anti-reflection layer 112 on the passivation anti-reflection layer 112 includes steps S502 to S504.

S502: Forming a first filling groove 204 in the passivation anti-reflection layer 112, thereby exposing the doped polysilicon layer 106 through the first filling groove 204.

Specifically, the first filling groove 204 is formed in and penetrates through the passivation anti-reflection layer 112, and the doped polysilicon layer 106 is exposed through the first filling groove 204. The first filling groove 204 is located in the metal contact region of the light-receiving surface. It can be understood that in a case where the doped polysilicon layer 106 and the tunnel layer 104 are not patterned, the first filling groove 204 can be simply located in the metal contact region of the light-receiving surface. Alternatively, in a case where the doped polysilicon layer 106 and the tunnel layer 104 are patterned to form the stacked structure 202, the first filling groove 204 can be formed on the stacked structure 202, and the width of the first filling groove 204 is smaller than the width of the stacked structure 202, with the width direction of the first filling groove 204 intersecting the extension direction of the stacked structure 202. In an embodiment, the width direction of the first filling groove 204 is perpendicular to the extension direction of the stacked structure 202. This structure can further ensure the passivation contact effect on the light-receiving surface.

In some embodiments, laser ablation can be adopted to remove the passivation anti-reflection layer 112 from the designated area for the first electrode 118, and an HF solution can be adopted to remove an oxide layer formed during the laser ablation, thus forming the first filling groove 204 exposing the doped polysilicon layer 106.

In some embodiments, step S502 includes printing an etching ink or slurry on the portion of the passivation anti-reflection layer 112 in the designated area for the first electrode 118; etching the portion of the passivation anti-reflection layer 112 in the designated area by the etching ink or slurry at a temperature of 50° C. to 500° C., thereby forming the first filling groove 204 that exposes the doped polysilicon layer 106. The method for manufacturing the heterojunction solar cell further includes washing with an alkaline solution or a water solution to remove the etching ink or slurry; and cleaning to remove organic or metal ion contaminations. The cleaning process can include alkaline cleaning, acid cleaning, and water rinsing. The alkaline cleaning solution can include an alkaline agent (e.g., KOH, NaOH, or TMAH), $H_2O_2$, and deionized water. The acid cleaning solution can include HCl, $H_2O_2$, and deionized water. The cleaning process does not remove the passivation anti-reflection layer 112.

S504: Forming the first electrode 118 by filling the first filling groove 204.

Specifically, the first electrode 118 fills the first filling groove 204 and is electrically connected to the doped polysilicon layer 106. A top surface of the first electrode 118 is higher than the top surface of the passivation anti-reflection layer 112. The material of the first electrode 118 includes, for example, a transparent oxide (e.g., doped indium oxide, tin oxide, zinc oxide, aluminum oxide, and/or tungsten oxide), silver, copper, gold, aluminum, tin, titanium, a silver-containing compound, a copper-containing compound, a gold-containing compound, an aluminum-containing compound, a tin-containing compound, and/or a titanium-containing compound. The first electrode 118 made of the transparent oxide can increase an effective light-receiving area of the light-receiving surface, thereby enhancing light absorption and photoelectric conversion efficiency of the heterojunction solar cell. In an embodiment, in a case where the doped polysilicon layer 106 and the tunnel layer 104 are patterned to form the stacked structure 202, the portion of the first electrode 118 that is higher than the top surface of the passivation anti-reflection layer 112 extends onto the stacked structure 202. The first electrode 118 on the passivation anti-reflection layer 112 can reduce light reflection and improve photoelectric conversion efficiency of the heterojunction solar cell. Further, the portion of the first electrode 118 that is higher than the top surface of the passivation anti-reflection layer 112 can have the same shape as the stacked structure 202.

Referring to FIG. 6, in an embodiment, the first electrode 118 includes a contact layer 120 and a lead-out electrode 122, and forming the first electrode by filling the first filling groove includes steps S602 to S604.

S602: Forming the contact layer 120 in a bottom of the first filling groove 204 to contact the doped polysilicon layer 106.

S604: Forming the lead-out electrode 122 in the first filling groove 204 to contact a top surface of the contact layer 120.

Specifically, a physical vapor deposition (PVD) method can be used to form the contact layer 120 in the first filling groove 204, and the contact layer 120 is in contact with the doped polysilicon layer 106. The contact layer 120 improves the contact between the lead-out electrode 122 and the doped polysilicon layer 106, thereby reducing the contact resistance. Subsequently, the lead-out electrode 122 can be formed in the first filling groove 204, and the lead-out electrode 122 is in contact with the contact layer 120. Thus, the lead-out electrode 122 is electrically connected to the doped polysilicon layer 106 via the contact layer 120. Exemplary methods for forming the contact layer 120 include screen printing, laser transfer-printing, evaporation, electroplating, etc. The lead-out electrode 122 is the electrode that extracts the first conductivity type carriers generated in the heterojunction solar cell. The solar cell can be then connected a load through the lead-out electrode 122, thereby supplying electric power to the load. The material of the lead-out electrode 122 includes, but is not limited to, silver, copper, gold, aluminum, tin, titanium, a silver-containing compound, a copper-containing compound, a gold-containing compound, an aluminum-containing compound, a tin-containing compound, and/or a titanium-containing compound.

The material of the contact layer 120 includes, but is not limited to, one or more transparent oxides, such as doped indium oxide, tin oxide, zinc oxide, aluminum oxide, and tungsten oxide. The contact layer 120 made of the transparent oxide can increase an effective light-receiving area of the light-receiving surface, thereby enhancing light absorption and photoelectric conversion efficiency of the heterojunction solar cell.

In an embodiment, forming the contact layer 120 in the bottom of the first filling groove 204 to contact the doped polysilicon layer 106 includes: forming the contact layer 120 in contact with the doped polysilicon layer 106 on an inner wall of the first filling groove 204, wherein the contact layer 120 extends along the inner wall of the first filling groove 204 onto the passivation anti-reflection layer 112 to cover the passivation anti-reflection layer 112. The contact between the lead-out electrode 122 and the passivation anti-reflection layer 112 can be improved by the contact layer 120. Additionally, the contact layer 120 can further reduce light reflection loss on the light-receiving surface of the heterojunction solar cell, thereby increasing the photogenerated current, and thus improving the photovoltaic conversion efficiency of the heterojunction solar cell.

In an embodiment, the method for manufacturing the heterojunction solar cell further includes: forming an electrically conductive back layer 124 on the surface of the doped semiconductor back layer 116 away from the substrate 102; and forming a second electrode 126 on the surface of the electrically conductive back layer 124 away from the substrate 102. The electrically conductive back layer 124 is electrically isolated from the contact layer 120 at the edges of the heterojunction solar cell. The electrically conductive back layer 124 can serve as a back surface field layer to reduce surface recombination of charge carriers and light reflection loss on the back side, thereby increasing the photogenerated current, and thus improving the photovoltaic conversion efficiency of the heterojunction solar cell. Additionally, the electrically conductive back layer 124 can improve the electrical conductivity between the doped semiconductor back layer 116 and the subsequently formed second electrode 126, reducing contact resistance. The second electrode 126 is configured to extract the second conductivity type carriers generated in the heterojunction solar cell. The heterojunction solar cell is electrically connected to a load through the first electrode 118 and the second electrode 126 so as to supply electric power to the load. Exemplary methods for forming the second electrode 126 include screen printing, laser transfer-printing, evaporation, electroplating, etc. The material of the electrically conductive back layer 124 includes, but is not limited to, a transparent oxide such as doped indium oxide, tin oxide, zinc oxide, aluminum oxide, and/or tungsten oxide. The material of the second electrode 126 includes, but is not limited to, silver, copper, gold, aluminum, tin, titanium, a silver-containing compound, a copper-containing compound, a gold-containing compound, an aluminum-containing compound, a tin-containing compound, and/or a titanium-containing compound.

It should be understood that, though the steps in the flow chart are shown sequentially as indicated by the arrows in FIG. 1, these steps are not necessarily executed sequentially in the order indicated by the arrows. Unless otherwise specified herein, the sequence of the steps is not strictly limited, and the steps can be performed in other orders. Moreover, at least some of the steps in FIG. 1 can include multiple sub-steps or multiple stages, these sub-steps or stages are not necessarily performed at the same time, but can be performed at different times. These sub-steps or stages are not necessarily to be sequentially performed, but can be performed alternately or in turn with at least some of other steps or the sub-steps or stages of other steps.

An embodiment of the present disclosure provides a heterojunction solar cell manufactured by using the method as described above. The parts of the heterojunction solar cell that are the same or corresponding to those described in the method as described above will not be repeated herein.

Referring to FIG. 2, an embodiment of the present disclosure provides a heterojunction solar cell, including a substrate 102, a tunnel layer 104, and a doped polysilicon layer 106. The substrate 102 has a first conductivity type. The tunnel layer 104 is located on a light-receiving surface of the substrate 102. The doped polysilicon layer 106 is located on a top surface of the tunnel layer 104 and has the first conductivity type. The parts of the heterojunction solar cell that are the same or corresponding to those described in the method as described above will not be repeated herein.

In the above-described heterojunction solar cell, the tunnel layer 104 and the doped polysilicon layer 106 are sequentially formed on the light-receiving surface of the substrate 102. By replacing the amorphous silicon/microcrystalline silicon layers which forms the heterojunction on the light-receiving surface of the conventional heterojunction solar cell with the tunnel layer 104 and the doped polysilicon layer 106, the damage, caused by UV radiation, to the light-receiving surface of the heterojunction solar cell is reduced, thereby alleviating the degradation of the photoelectric conversion efficiency and improving the efficiency of the heterojunction solar cell. In the present disclosure, the heterojunction is not formed on at least part of the light-receiving surface of the heterojunction solar cell, and can be entirely eliminated from the light-receiving surface of the heterojunction solar cell.

Referring to FIG. 3, in an embodiment, the heterojunction solar cell further includes a front surface field layer 108, which is located on the light-receiving surface of the substrate 102. The front surface field layer 108 has the first conductivity type. The tunnel layer 104 is located on a top surface of the front surface field layer 108. The front surface field layer 108 can reduce surface recombination of charge carriers, thereby improving the open-circuit voltage and photoelectric conversion efficiency of the heterojunction solar cell.

In an embodiment, the tunnel layer 104 includes a tunnel oxide layer, which further enables effective tunneling of majority carriers.

Referring to FIG. 6, in an embodiment, the light-receiving surface of the substrate 102 includes a metal contact region and a non-metal contact region outside the metal contact region. The doped polysilicon layer 106 and the tunnel layer 104 are located in the metal contact region. The non-metal contact region is not covered by the doped polysilicon layer 106 and the tunnel layer 104. This structure reduces the area of the light-receiving surface covered by the doped polysilicon layer 106, reducing the light absorption loss on the light-receiving surface of the heterojunction solar cell while maintaining the passivation contact effect, thereby further increasing the short-circuit current and photoelectric conversion efficiency of the solar cell.

Referring to FIG. 6, in an embodiment, the heterojunction solar cell further includes a passivation anti-reflection layer 112, which is located on the doped polysilicon layer 106, and a first electrode 118, which penetrates through the passivation anti-reflection layer 112 and is electrically connected to the doped polysilicon layer 106. The passivation anti-reflection layer 112 reduces the light reflection loss on the light-receiving surface of the heterojunction solar cell, increasing the photogenerated current, and thus improving the photoelectric conversion efficiency of the heterojunction solar cell. Additionally, the passivation anti-reflection layer 112 can further protect and passivate the solar cell. It can be understood that in a case where the doped polysilicon layer 106 and the tunnel layer 104 cover both the metal contact region and the non-metal contact region of the light-receiving surface of the substrate 102, the passivation anti-reflection layer 112 is located on the top surface of the doped polysilicon layer 106. Alternatively, in a case where the doped polysilicon layer 106 and the tunnel layer 104 are located only in the metal contact region, and the non-metal contact region is not covered by the doped polysilicon layer 106 and the tunnel layer 104, the passivation anti-reflection layer 112 is located on the top surface of the doped polysilicon layer 106 and extends along the sidewalls of the doped polysilicon layer 106 onto and cover the surface of the front surface field layer 108. This structure further reduces the light reflection loss on the light-receiving surface of the heterojunction solar cell, increasing the photogenerated current, and thus improving the photoelectric conversion efficiency of the heterojunction solar cell. The first electrode 118 is configured to connect the heterojunction solar cell to a load, thus providing electric power to the load.

In an embodiment, the top surface of the first electrode 118 is higher than the top surface of the passivation anti-reflection layer 112. The portion of the first electrode 118 that is higher than the top surface of the passivation anti-reflection layer 112 extends onto at least a portion of the surface of the passivation anti-reflection layer 112. The portion of the first electrode 118, located on the passivation anti-reflection layer 112, can reduce light reflection and improve photoelectric conversion efficiency of the heterojunction solar cell.

Referring to FIG. 6, in an embodiment, the first electrode 118 includes a lead-out electrode 122 and a contact layer 120. The lead-out electrode 122 extends from the top surface of the passivation anti-reflection layer 112 into the passivation anti-reflection layer 112. The top surface of the contact layer 120 is in contact with a bottom surface of the lead-out electrode 122, and a bottom surface of the contact layer 120 is in contact with the doped polysilicon layer 106. The lead-out electrode 122 is electrically connected to the doped polysilicon layer 106 through the contact layer 120. The contact layer 120 can improve the contact between the lead-out electrode 122 and the doped polysilicon layer 106, thereby reducing the contact resistance.

In an embodiment, the contact layer 120 includes a first sub-contact layer and a second sub-contact layer integrated with the first sub-contact layer. The first sub-contact layer is located between the lead-out electrode 122 and the doped polysilicon layer 106. The second sub-contact layer is located on the passivation anti-reflection layer 112. The first sub-contact layer of the contact layer 120 can improve the contact between the lead-out electrode 122 and the passivation anti-reflection layer 112. The second sub-contact layer of the contact layer 120 can further reduce the light reflection loss on the light-receiving surface of the heterojunction solar cell, increasing the photogenerated current, and thereby improving the photoelectric conversion efficiency of the heterojunction solar cell. The contact layer 120 can be made of a transparent oxide, which can increase an effective light-receiving area of the light-receiving surface, thereby enhancing light absorption and photoelectric conversion efficiency of the heterojunction solar cell.

In an embodiment, the heterojunction solar cell further includes an intrinsic amorphous silicon layer 114, a doped semiconductor back layer 116 of a second conductivity type, an electrically conductive back layer 124, and a second electrode 126. The intrinsic amorphous silicon layer 114 is located on a shadowed surface of the substrate 102. The doped semiconductor back layer 116 is located on a top surface (i.e., the surface away from the substrate 102) of the intrinsic amorphous silicon layer 114. The electrically conductive back layer 124 is located on the surface of the doped semiconductor back layer 116 away from the substrate 102. The second electrode 126 is located on the surface of the electrically conductive back layer 124 away from the substrate 102. The second conductivity type is opposite to the first conductivity type. The electrically conductive back layer 124 is electrically isolated from the contact layer 120 at the edges of the heterojunction solar cell. The intrinsic amorphous silicon layer 114 passivates the shadowed surface of the substrate 102, while the p-n junction is formed between the doped semiconductor back layer 116 and the substrate 102, resulting in the heterojunction solar cell. The electrically conductive back layer 124 can serve as a back surface field layer to reduce surface recombination of charge carriers and light reflection loss on the back side, thereby increasing the photogenerated current, and thus improving the photovoltaic conversion efficiency of the heterojunction solar cell. Additionally, the electrically conductive back layer 124 can improve the electrical conductivity between the doped semiconductor back layer 116 and the second electrode 126, thereby reducing the contact resistance. The second electrode 126 is configured to extract the second conductivity type carriers generated in the heterojunction solar cell. The heterojunction solar cell can be electrically connected to a load through the first electrode 118 and the second electrode 126 so as to supply electric power to the load.

In some embodiments, the material of the doped semiconductor back layer 116 includes at least one of a doped amorphous silicon material, a doped nanocrystalline silicon material, and a doped microcrystalline silicon material. For example, the material of the doped semiconductor back layer 116 can be the doped amorphous silicon material, the doped nanocrystalline silicon material, or the doped microcrystalline silicon material, or can be stacked layers of any two or three of the doped amorphous silicon material, the doped nanocrystalline silicon material, and the doped microcrystalline silicon material.

An embodiment of the present disclosure provides a photovoltaic module including a plurality of above-described heterojunction solar cells. The photovoltaic module can provide electric power to a load.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A heterojunction solar cell, comprising:

a substrate of a first conductivity type;

a tunnel layer located on a light-receiving surface of the substrate;

a doped polysilicon layer located on a surface of the tunnel layer away from the substrate, the doped polysilicon layer having the first conductivity type;

a passivation anti-reflection layer located on the doped polysilicon layer;

a first electrode penetrating through the passivation anti-reflection layer and electrically connected to the doped polysilicon layer; and a front surface field layer located on the light-receiving surface, the front surface field layer having the first conductivity type;

wherein the first electrode includes:

a lead-out electrode extending from a surface of the passivation anti-reflection layer away from the substrate into the passivation anti-reflection layer; and a contact layer, a surface of the contact layer away from the substrate being in contact with a surface of the lead-out electrode adjacent to the substrate, and a surface of the contact layer adjacent to the substrate being in contact with the doped polysilicon layer; and wherein the contact layer includes:

a first sub-contact layer located between the lead-out electrode and the doped polysilicon layer; and a second sub-contact layer located on the surface of the passivation anti-reflection layer away from the substrate, the second sub-contact layer and the first sub-contact layer are integrated as a single member;

wherein the tunnel layer is located on a surface of the front surface field layer away from the substrate.

2. The heterojunction solar cell according to claim 1, wherein the tunnel layer includes a tunnel oxide layer.

3. The heterojunction solar cell according to claim 1, further comprising:

an intrinsic amorphous silicon layer located on a shadowed surface of the substrate, the shadowed surface being opposite to the light-receiving surface;

a doped semiconductor back layer located on a surface of the intrinsic amorphous silicon layer away from the substrate; and an electrically conductive back layer located on a surface of the doped semiconductor back layer away from the substrate;

wherein a material of the doped semiconductor back layer includes at least one of a doped amorphous silicon material, a doped nanocrystalline silicon material, and a doped microcrystalline silicon material.

4. The heterojunction solar cell according to claim 1, wherein a heterojunction is entirely eliminated from the light-receiving surface of the heterojunction solar cell.

5. A photovoltaic module comprising the heterojunction solar cell according to claim 1.

6. The heterojunction solar cell according to claim 1, wherein the contact layer comprises a transparent oxide.

7. The heterojunction solar cell according to claim 6, wherein the transparent oxide comprises doped indium oxide, tin oxide, zinc oxide, aluminum oxide, or tungsten oxide.

* * * * *